(12) United States Patent
Zhao et al.

(10) Patent No.: US 12,119,579 B2
(45) Date of Patent: Oct. 15, 2024

(54) FEMALE CONNECTOR AND CONNECTOR ASSEMBLY

(71) Applicant: Tianjin Laird Technologies Limited, Tianjin (CN)

(72) Inventors: Jingqi Zhao, Tianjin (CN); Jihai Tang, Tianjin (CN); Yifan Xu, Tianjin (CN)

(73) Assignee: Tianjin Laird Technologies Limited, Tianjin (CN)

( * ) Notice: Subject to any disclaimer, the term of this patent is extended or adjusted under 35 U.S.C. 154(b) by 440 days.

(21) Appl. No.: 17/772,920

(22) PCT Filed: Dec. 7, 2020

(86) PCT No.: PCT/CN2020/134279
§ 371 (c)(1),
(2) Date: Jun. 22, 2022

(87) PCT Pub. No.: WO2021/083392
PCT Pub. Date: May 6, 2021

(65) Prior Publication Data
US 2022/0376416 A1      Nov. 24, 2022

(30) Foreign Application Priority Data
Oct. 28, 2019   (CN) .......................... 201921826310.3

(51) Int. Cl.
*H01R 12/00* (2006.01)
*H01R 12/72* (2011.01)
*H01R 12/77* (2011.01)

(52) U.S. Cl.
CPC ......... *H01R 12/721* (2013.01); *H01R 12/774* (2013.01); *H01R 12/775* (2013.01)

(58) Field of Classification Search
CPC ... H01R 12/721; H01R 12/774; H01R 12/775
See application file for complete search history.

(56) References Cited

U.S. PATENT DOCUMENTS 7,850,473 B1 * 12/2010 Ozeki .................... H01R 12/79
439/260
7,883,369 B1 * 2/2011 Sun ....................... H01R 12/721
439/607.35
(Continued)

FOREIGN PATENT DOCUMENTS

| CN | 105392271 A | 3/2016 |
| CN | 106211542 A | 12/2016 |

(Continued)

OTHER PUBLICATIONS

PCT International Search Report and Written Opinion (and its English translation) for PCT/CN2020/134279 (WO2021/083392) that is the parent application to the instant application; dated Mar. 9, 2021 (26 pages).

*Primary Examiner* — Phuong Chi Thi Nguyen
(74) *Attorney, Agent, or Firm* — Harness, Dickey & Pierce, P.L.C.; Anthony G. Fussner

(57) ABSTRACT

A female connector is connected to a PCB board internally provided with a signal layer and a ground layer. A surface of the PCB board includes conductive pads connected to the signal layer and the ground layer. The female connector includes a female terminal having first and second ends. The second end includes differential signal pairs arranged at intervals and ground pins each located between an adjacent two of the differential signal pairs. The differential signal pairs are connectable to the signal layer through the conductive pads. The ground pins are connectable to the ground layer through the conductive pads. A high-frequency radiation area is in the vicinity of a joint between the differential signal pair and the conductive pad when the first end is mated with a male connector or circuit board. A wave-absorbing material is disposed in a spatial range covered by the high-frequency radiation area.

29 Claims, 3 Drawing Sheets

(56) References Cited

U.S. PATENT DOCUMENTS

| | | | |
|---|---|---|---|
| 8,057,263 B1 * | 11/2011 | Howard | H01R 12/721 |
| | | | 439/631 |
| 8,142,207 B1 * | 3/2012 | Ljubijankic | H01R 13/6473 |
| | | | 439/95 |
| 8,177,564 B1 * | 5/2012 | Ito | H01R 13/6471 |
| | | | 439/108 |
| 9,472,900 B1 | 10/2016 | Phillips et al. | |
| 9,531,130 B1 | 12/2016 | Phillips et al. | |
| 9,570,824 B1 * | 2/2017 | Chien | H01R 12/724 |
| 9,871,325 B2 | 1/2018 | Patel et al. | |
| 2016/0324001 A1 | 11/2016 | Zhai et al. | |
| 2016/0336691 A1 | 11/2016 | de Boer | |
| 2017/0006698 A1 | 1/2017 | Huang et al. | |
| 2020/0099149 A1 | 3/2020 | Xu et al. | |

FOREIGN PATENT DOCUMENTS

| | | |
|---|---|---|
| CN | 107017526 A | 8/2017 |
| CN | 107069264 A | 8/2017 |
| CN | 107069266 A | 8/2017 |
| CN | 208256947 U | 12/2018 |
| CN | 208862209 U | 5/2019 |
| CN | 111029857 A | 4/2020 |
| CN | 210535884 U | 5/2020 |
| CN | 210535947 U | 5/2020 |
| CN | 210692927 U | 6/2020 |
| CN | 210897863 U | 6/2020 |
| EP | 1606859 B1 | 2/2007 |

\* cited by examiner

FEMALE CONNECTOR AND CONNECTOR ASSEMBLY

CROSS-REFERENCE TO RELATED PATENT APPLICATION

This patent application is a U.S. national stage filing under 35 U.S.C. § 371 of PCT International Application No. PCT/CN2020/134279 filed Dec. 7, 2020 (published as WO2021/083392 on May 6, 2021), which claims priority to and the benefit of Chinese patent application with an application number of 201921826310.3 filed on Oct. 28, 2019. The entire contents of these applications are incorporated herein by reference in their entirety.

FIELD

The present disclosure relates to a technical field of connectors, and particularly to a female connector, and a connector combination formed by the mating of the female connector with a male connector or a gold finger circuit board.

BACKGROUND

Connectors are widely used in the electronic field. With the rapid development of the big data, the 5G technology and the artificial intelligence applications, the connector must meet the requirements of high-speed and high-density applications, which brings challenges to the signal integrity design of the connector, especially how to solve the problem of the crosstalk of differential signals under a high frequency/high density.

Usually, there are two traditional solutions: one is to shield a certain pair of differential signals or differential signals on a certain column in the connector by wrapping the connector with metal materials and electroplated plastic materials; and the other is to connect the ground pins of each pair of differential signals, for example through electrically conductive plastic or metal, using a grounding improvement method. The traditional design method uses too many shielding materials and grounding materials, which leads to negative effects such as an increased connector weight and a large plugging force. Meanwhile, it is very difficult for the traditional methods to further realize a higher differential density.

In addition to the above two methods, in order to solve the problem of the crosstalk of the differential signal under the high frequency/high density, the connector or the conductor/conductor pair may be wrapped with a wave-absorbing material. The wave-absorbing material is used to eliminate the crosstalk of differential signals through the absorption effect of the wave-absorbing material on electromagnetic waves. However, there is a problem in the traditional way of wrapping with the wave-absorbing material, i.e. the wave-absorbing material absorbs electromagnetic waves non-selectively, so that the wave-absorbing material entirely wrapping the connector absorbs the crosstalk electromagnetic waves of the differential signals, while absorbing the normally transmitted electrical signals. As a result, it is easier to destroy the signal integrity of the connector.

SUMMARY

Embodiments of the present disclosure provide a female connector, and a connector combination formed by the mating of the female connector with a male connector or a gold finger circuit board. By disposing a wave-absorbing material in an area where a high-frequency radiation is easily generated during the use of the connector, the embodiments of the present disclosure realize the selectivity and the pertinence for the wave-absorbing material to absorb electromagnetic waves, thereby not only absorbing crosstalk signals of differential signals, but also keeping normally transmitted electrical signals. Thus, the signal integrity of the connector is guaranteed, and the overall weight of the connector is light.

In order to achieve the above objective, the present disclosure provides the following technical solutions.

A female connector configured for being connected to a PCB board, which is internally provided with a signal layer and a ground layer, the PCB board being provided on a surface thereof with conductive pads, which are connected to the signal layer and the ground layer, wherein the female connector includes: a female terminal having a first end for mating with a male connector or a gold finger circuit board, and a second end opposite to the first end, the second end being provided with a plurality of differential signal pairs arranged at intervals and ground pins each located between any two adjacent pair of the differential signal pairs, the differential signal pairs being connectable to the signal layer through the conductive pad, and the ground pins being connectable to the ground layer through the conductive pad, and a high-frequency radiation area being formed in the vicinity of a joint between the differential signal pairs and the conductive pad when the first end is mated with the male connector or the gold finger circuit board; and a wave-absorbing material disposed in a spatial range covered by the high-frequency radiation area.

A connector combination, comprising a male connector and a female connector, wherein the male connector comprises a male terminal; wherein the female connector is configured for being connected to a PCB board, which is internally provided with a signal layer and a ground layer, the PCB board being provided on a surface thereof with conductive pads, which are connected to the signal layer and the ground layer; wherein the female connector comprises: a female terminal having a first end for mating with the male connector, and a second end opposite to the first end, the second end being provided with a plurality of differential signal pairs arranged at intervals and ground pins each located between any two adjacent pairs of the differential signal pairs, the differential signal pairs being connectable to the signal layer through the conductive pad, the ground pins being connectable to the ground layer through the conductive pad, and a high-frequency radiation area being formed in the vicinity of a joint between the differential signal pairs and the conductive pad when the first end is mated with the male connector; and a wave-absorbing material disposed in a spatial range covered by the high-frequency radiation area.

A connector combination, comprising a gold finger circuit board and a female connector, wherein the gold finger circuit board comprises a gold finger insertion tip; wherein the female connector is configured for being connected to a PCB board, which is internally provided with a signal layer and a ground layer, the PCB board being provided on a surface thereof with conductive pads, which are connected to the signal layer and the ground layer; wherein the female connector comprises: a female terminal having a first end for mating with the gold finger insertion tip, and a second end opposite to the first end, the second end being provided with a plurality of differential signal pairs arranged at intervals and ground pins each located between any two adjacent pairs of the differential signal pairs, the differential signal pairs being connectable to the signal layer through the conductive pad, and the ground pins being connectable to the ground layer through the conductive pad, and a high-frequency radiation area being formed in the vicinity of a joint between the differential signal pairs and the conductive pad when the first end is mated with the gold finger insertion tip; and a wave-absorbing material disposed in a spatial range covered by the high-frequency radiation area.

The inventor of the present disclosure creatively discovered and found out that a high-frequency radiation may be easily generated in the vicinity of a joint between a differential signal pair and a conductive pad due to an antenna effect during the use of the connector, and practices show that the wave-absorbing material only needs to be disposed in an area where the high-frequency radiation may be easily generated rather than areas without any high-frequency radiation. By selectively or pertinently disposing the wave-absorbing material, signals are also selectively absorbed by the wave-absorbing material. That is, only crosstalk signals are absorbed without affecting normal signals, so that the integrity of differential signals may be well ensured. In addition, the way of selectively or pertinently disposing a wave-absorbing material in a high-frequency radiation area is adopted to replace the way of entirely wrapping (a plastic bracket and a shell) with a wave-absorbing material in the prior art, so as to overcome the signal crosstalk without using any additional shielding material, which not only greatly reduces the use amount of the wave-absorbing material, as well as an overall weight and costs of consumables and process implementation of the connector, but also helps in improving the density of differential pairs, and meeting the application requirements of high-speed and high-density connectors in the current technical development.

DETAILED DESCRIPTION

In order to make persons in this technical field better understand the technical solutions in the present disclosure, the technical solutions of the embodiments of the present disclosure will be clearly and completely described below with reference to the drawings for the embodiments of the present disclosure. Obviously, those embodiments described are only a part, rather than all, of the embodiments of the present disclosure. Based on the embodiments in the present disclosure, any other embodiments obtained by those of ordinary skills in the art without paying any creative labor should fall within the protection scope of the present disclosure.

It should be noted that when an element is referred to as being 'disposed on' another element, it may be directly on another element or there may be an intermediate element. When an element is considered as being 'connected to' to another element, it may be directly connected to another element or there may be an intermediate element. The terms 'vertical', 'horizontal', 'left', 'right' and similar expressions used herein are for illustration purposes only, and are not intended to indicate a unique embodiment.

Unless otherwise defined, all of the technical and scientific terms used herein have the same meanings commonly understood by a person skilled in the technical field of the present disclosure. The terms used in the specification of the present disclosure are only for the purpose of describing specific embodiments, and are not intended to limit the present disclosure. As used herein, the term 'and/or' includes any and all combinations of one or more related listed items.

Figure 1:
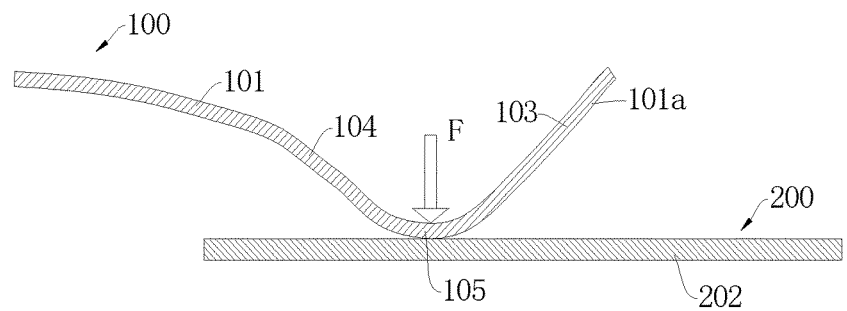
FIG. 1 is a structural schematic diagram of a connector combination formed by the mating of a female connector and a male connector according to a non-limiting embodiment of the present disclosure.
Figure 2:
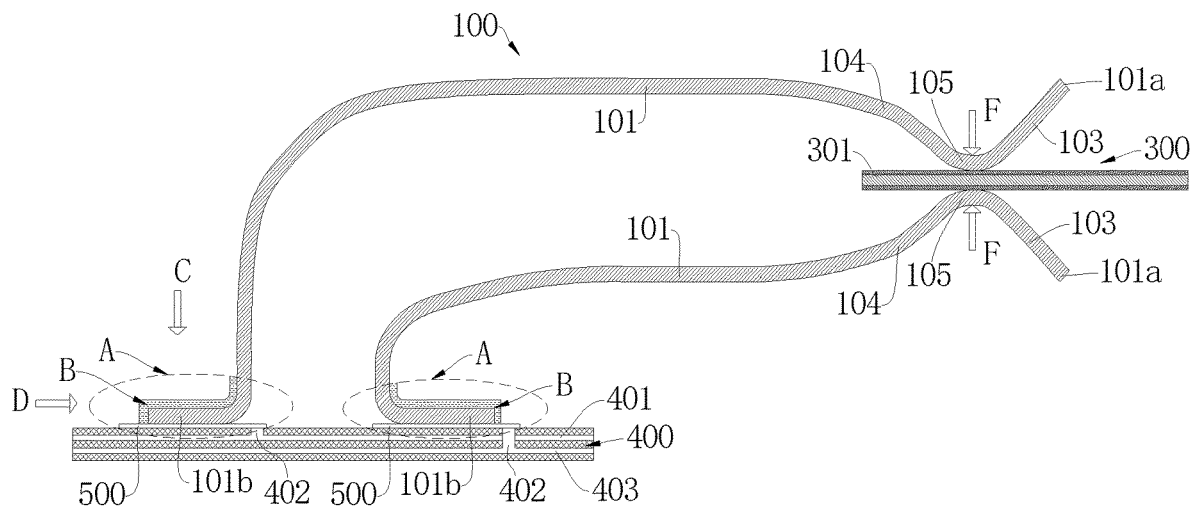
FIG. 2 is a structural schematic diagram of a connector combination formed by the mating of a female connector and a gold finger circuit board according to a non-limiting embodiment of the present disclosure.

As illustrated in FIGS. 1 and 2, embodiments of the present disclosure provide a female connector 100, and a connector combination formed by the mating of the female connector 100 with a male connector 200 or a gold finger circuit board 300.

The female connector 100 includes a female terminal 101 for mating with the male connector 200 or the gold finger circuit board 300. The female terminal 101 has two opposite ends, i.e. a first end 101a (a right end illustrated in FIGS. 1 and 2) for mating with the male connector 200 or the gold finger circuit board 300, and a second end 101b (a lower end illustrated in FIG. 1) facing away from the first end 101a for electrical connection with a PCB board 400.

In order to make the male connector 200 or the gold finger circuit board 300 successfully mate with the female connector 100, the first end 101a of the female terminal 101 may be expanded radially outward to form a trumpet-shaped guide head 103 for blind mating between the male connector 200 or the gold finger circuit board 300 and the female connector 100. In this way, an operator can hold the male connector 200 or the gold finger circuit board 300 to successfully complete a mating operation with the female connector 100 under the guidance of the trumpet-shaped guide head 103.

In addition, in order to ensure a good electrical connection between the male connector 200 or the gold finger circuit board 300 and the female connector 100 after the mating, the female terminal 101 includes an elastic cantilever section 104, which is bent at at least one position to form elastic pressing portions 105 for an interference fit contact with the male connector 200 or the gold finger circuit board 300. In this embodiment, one of the elastic pressing portions 105 is disposed close to the trumpet-shaped guide head 103.

The cantilever section 104 has a preset length, so as to have an elastic force F for unidirectionally pressing/bidirectionally clamping the male connector 200 or bidirectionally clamping the gold finger circuit board 300. As illustrated in FIG. 2, the gold finger circuit board 300 is bidirectionally clamped by the elastic pressing portions 105 formed on the cantilever sections 104. Since the gold finger circuit board 300 is bidirectionally clamped by the elastic pressing portions 105, the gold finger circuit board 300 comes into a single-point contact with the single female terminal 101, thereby realizing a better mating between the gold finger circuit board 300 and the female terminal 101.

In this embodiment, there may be only one elastic pressing portion 105 formed on the cantilever section 104. At this time, the mating between the gold finger circuit board 300 and the female connector 100 is in a case of male connector being straight and female connector being bent.

Since the bending performance of the traditional gold finger circuit board 300 is poor, the gold finger circuit board 300 in this embodiment can adopt the straight male connector of the prior art. However, with the development of technologies, the bendable or flexible gold finger circuit board 300 is gradually used. It is feasible that the gold finger circuit board 300 is prepared in a bent or flexed shape. Therefore, this embodiment does not exclude a case of male connector being bent and female connector being bent for the mating between the gold finger circuit board 300 and the female connector 100.

In the embodiment illustrated in FIG. 1, it is the case where the female terminal 101 presses the male terminal 202 of the male connector 200 unidirectionally. In which, the female terminal 101 and the male terminal 202 of the male connector 200 may be mated through a single-point contact under the condition that the female terminal 101 can contact well with the male terminal 202 of the male connector 200. At this time, the mating between the male connector 200 and the female connector 100 is in a case of male connector being straight and female connector being bent.

Of course, the female terminal 101 and the male terminal 202 of the male connector 200 may also be mated through a two-or-more-point contact, i.e. at this time, two or more elastic pressing portions 105 are formed on the cantilever section 104 of the female terminal 101, and two or more elastic fitting portions are also formed on the male terminal 202. The two or more elastic fitting parts and the two or more elastic pressing portions 105 contact to realize the two-or-more-point contact between the male terminal 202 and the female terminal 101. At this time, the mating between the male connector 200 and the female connector 100 is in a case of male connector being bent and female connector.

As illustrated in FIG. 2, the PCB board 400 is internally provided with a signal layer 401 and a ground layer 403, and the PCB board 400 is provided on a surface thereof with conductive pads 500 which are connected to the signal layer 401 and the ground layer 403. In this embodiment, the second end 101b of the female terminal 101 is connected to the signal layer 401 or the ground layer 403 of the PCB board 400 through the conductive pads 500.

The signal layer 401 and the ground layer 403 are disposed in parallel in the PCB board 400 at an interval, and the conductive pads 500 may be SMD pads disposed on the surface (an upper surface illustrated in FIG. 2) of the PCB board 400. The conductive pads 500 may be connected to the corresponding signal layer 401 and ground layer 403 through copper deposition holes 402 disposed in the PCB board 400. Specifically, the PCB board 400 is provided with copper deposition holes 402 for connecting the signal layer 401 and the ground layer 403 to the surface of the PCB board 400, and the conductive pads 500 are connected to the signal layer 401 and the ground layer 403 through the copper deposition holes 402. In which, the copper deposition holes 402 may be provided with a conductive medium to realize a connection of the signal layer 401 and the ground layer 403 with the conductive pads 500.

Actually, the PCB board 400 may include a plurality of different functional layers, such as a signal layer, an intermediate board layer, an internal electrical layer, a silk screen layer, a solder paste layer, a mechanical layer, a shielding layer, a solder mask layer, solder flux layer, etc. In order to clearly and briefly describe the technical solution of this embodiment, those parts will not be repeated herein, and are simplified accordingly the drawings for the specification. However, it should be understood that the scope of the embodiments of the present application is not limited thereto.

Figure 3:
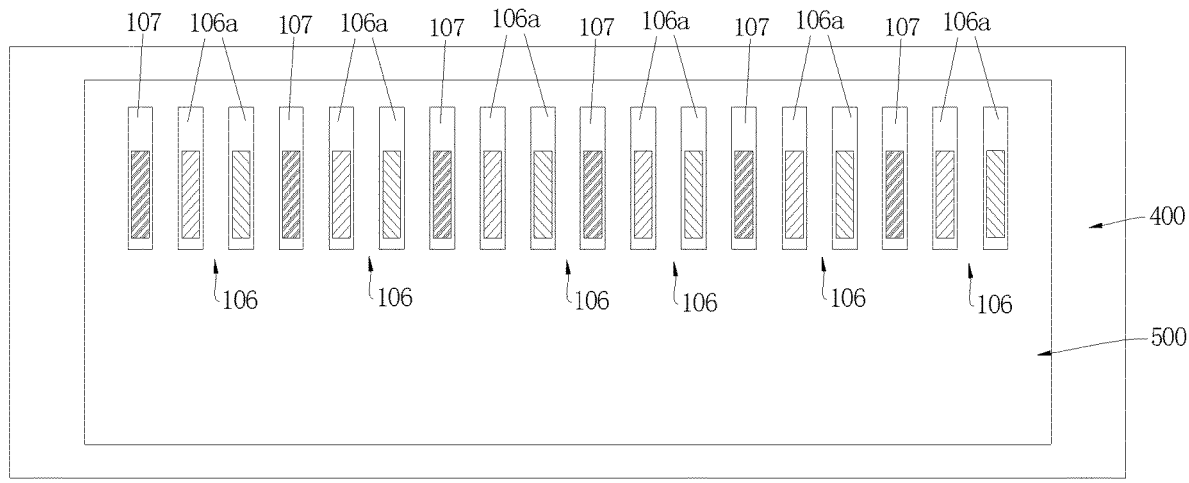
FIG. 3 is a structural schematic diagram in a top view from a viewing angle C in FIG. 2.

As illustrated in FIG. 3, the second end 101b of the female terminal 101 is provided with a plurality of differential signal pairs 106 arranged at intervals, and ground pins (G pins) 107 each located between any two adjacent pairs of the differential signal pairs 106. The differential signal pairs 106 and the ground pin 107 are connected to the signal layer 401 and the ground layer 403 through the conductive pads 500, respectively. In this embodiment, the differential signal pairs 106 and the ground pin 107 may be connected to the conductive pads 500 by soldering. Further, the second end 101b of the female terminal 101 may be horizontally bent, and the differential signal pairs 106 and the ground pin 107 are formed or disposed on the horizontally bent portion of the second end 101b. In this way, a contact connection area of the differential signal pairs 106 and the ground pin 107 with the conductive pads 500 can be increased, a connection strength and stability can be improved, and a stable signal transmission can be ensured.

As illustrated in FIG. 3, each of the differential signal pairs 106 may include two differential signal pins (S pins) 106a for transmitting differential signals with the same polarity and opposite phases respectively. Therefore, signal pins on the second end 101b of the female terminal 101 are arranged in the form of GSSGSSGSSGSS . . . . The ground pin 107 located between two adjacent differential signal pairs 106 can shield the signals of the two adjacent differential signal pairs 106 and reduce or prevent the signal crosstalk between the two adjacent differential signal pairs 106.

After the female connector 100 is mated with the male connector 200 or the gold finger circuit board 300, the differential signal is transmitted from one end to the other end (the first end 101a→the second end 101b, or the second end 101b→the first end 101a). At a joint between the differential signal pairs 106 and the conductive pad 500, the transmission of the differential signal depends on a portion of the differential signal pairs 106 in contact with the conductive pad 500. Specifically, the differential signal is transmitted via a surface of the portion of the differential signal pairs 106 in contact with the conductive pad 500, and then transmitted to the signal layer via the copper deposition hole 402. However, after a long-term study, the inventor of the present disclosure finds that in a high-frequency operation condition, a high-frequency radiation area A can be easily formed at the joint between the differential signal pairs 106 and the conductive pad 500. Specifically, an area outside the copper deposition hole 402 at the joint between the conductive pad 500 and the differential signal pairs 106 is exposed and suspended. Therefore, due to the antenna effect, electric charges are accumulated on surfaces of the conductive pad 500 and the differential signal pairs 106 in the area, and then the high-frequency radiation area A is formed in the area outside the copper deposition hole 402 at the joint between the conductive pad 500 and the differential signal pairs 106.

As described above, in order to solve the problem of the crosstalk of differential signals, the wave-absorbing material may be used to absorb the crosstalk signals, and specifically, the connector is entirely wrapped with the wave-absorbing material. However, the way of entirely wrapping with the wave-absorbing material will lead to an undifferentiated signal absorption, which is even more detrimental to the integrity of the differential signal. In addition, the entirely wrapping with the wave-absorbing material will increase the overall weight of the connector, and consume a lot of wave-absorbing materials, so the costs of consumables and process implementation are high.

In view of this, after long-term field practices, the inventor of the present disclosure finds that the above problem can be well solved by pertinently disposing a wave-absorbing material B in an area A where the high-frequency radiation is likely to occur due to the antenna effect, while not disposing the wave-absorbing material B in other areas where no high-frequency radiation occurs. In this embodiment, the first wave-absorbing material B is disposed in a spatial range covered by the high-frequency radiation area A.

Since the wave-absorbing material B is selectively or pertinently disposed in the spatial range covered by the high-frequency radiation area A, the wave-absorbing material B can absorb the crosstalk signal on the one hand, without affecting the normal differential signal transmitted via the joint between the differential signal pairs 106 and the conductive pad 500, thereby ensuring the integrity of the differential signal. On the other hand, the wave-absorbing material B is only disposed in the spatial range covered by the high-frequency radiation area A, and a use amount thereof is small, so that the female connector 100 of this embodiment is lighter in weight and lower in cost compared with the connector entirely wrapped with the wave-absorbing material B in the prior art.

In this embodiment, the spatial range covered by the high-frequency radiation area A is a virtual space, which may be centered at the joint between the differential signal pairs 106 and the conductive pad 500, and expanded outward in a radial or spherical shape in a three-dimensional space. Actually, the size or dimension of the spatial range covered by the high-frequency radiation area A is related to many factors, such as a signal intensity, a material of the female terminal 101, a connection smoothness between the differential signal pairs 106 and the conductive pad 500, a signal frequency, a resonance frequency, etc., which is not limited herein.

Thus, as long as the position for disposing the wave-absorbing material B falls within the spatial range covered by the high-frequency radiation area A, the specific position and way for disposing the wave-absorbing material B and the material form thereof may be relatively free and flexible. Generally, the wave-absorbing material B may support a wide frequency operation scope from 1 GHZ to 100 GHZ, and the material form may be solid (for example, including but not limited to, layer, sheet, film, block, plate, strip, cylinder), liquid, powder and plastic particles, etc., and the disposing way may be adopted according to the different material forms to adapt to different occasions, including but not limited to, adhesion, hot melting, electroplating, brushing, painting, filling, injection molding, etc. Therefore, the wave-absorbing material B may be customized according to the signal frequency, the resonance frequency, etc., to improve the application range of the technical solution of this embodiment.

Figure 4A:
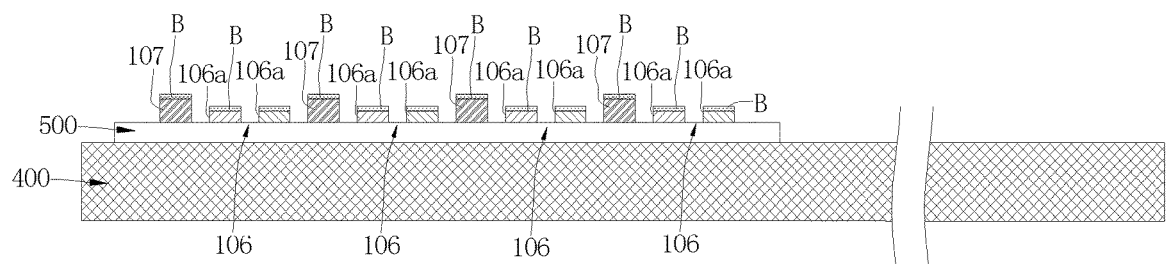
FIG. 4A is a structural schematic diagram of a first embodiment in a top view from a viewing angle D in FIG. 2.

For example, in a feasible embodiment, the wave-absorbing material B may be directly disposed on the differential signal pins 106a. Specifically, as illustrated in FIG. 4A, the position for disposing the wave-absorbing material B may only be surfaces of the differential signal pins 106a, and the material form may be a coating layer, an adhesion layer or a film. In which, the material form of the wave-absorbing material B as a coating layer or a film may be realized by a process such as spraying or electroplating; and the material form as an adhesion layer may be realized by preparing the wave-absorbing material B into layers or sheets, which are then stuck by viscose glue, or fixed by hot melting, etc. The size and the thickness of the coating layer, the adhesion layer or the film may be set according to the actual situation, and are not limited herein.

Further, the wave-absorbing material B may also be disposed on the ground pins 107. Similarly, the position for disposing the wave-absorbing material B may only be surfaces of the ground pins 107, and the material form may be a coating layer, an adhesion layer or a film. The specific way for disposing the wave-absorbing material B can refer to the above description, which will not be repeated herein.

In the embodiment illustrated in FIG. 4A, the wave-absorbing material B only wraps the upper surface of each of the differential signal pins 106a and the ground pins 107. However, it should be understood that when the material form is a coating layer, an adhesion layer or a film, the position for disposing the wave-absorbing material B is not limited to the upper surfaces of the differential signal pins 106a and the ground pins 107, but may also be side surfaces thereof. That is, the wave-absorbing material B may wrap part of the outer surfaces (for example, only the upper surfaces) of the differential signal pins 106a and the ground pins 107, or all of the outer surfaces (the upper surfaces+the side surfaces) thereof, which is not limited herein.

Figure 4B:
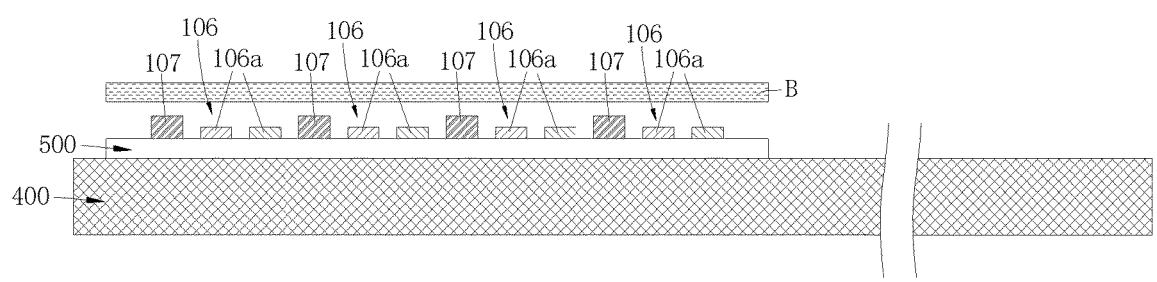
FIG. 4B is a structural schematic diagram of a second embodiment in a top view from a viewing angle D in FIG. 2.

In another feasible embodiment, the wave-absorbing material B may be disposed close to the differential signal pin 106a and the ground pin 107. Specifically, as illustrated in FIG. 4B, the wave-absorbing material B is in an integral structure, such as a layer-like structure, a sheet-like structure, a plate-like structure or a block-like structure. In this embodiment, the wave-absorbing material B may be fixed and supported by a plastic bracket which wraps the female terminal 101. That is, the wave-absorbing material B may be disposed on the plastic bracket and close to the differential signal pins 106a and the ground pins 107, without contacting the surfaces of the differential signal pins 106a and the ground pins 107.

Further, a distance between the wave-absorbing material B in an integral structure and the surfaces of the differential signal pins 106a and the ground pins 107 may be set according to the actual situation, and it is not limited herein. For example, when the overall volume of the female connector 100 is large, i.e., the volume of the plastic bracket which wraps and fixes the female terminal 101 is large, the degree of freedom and the space for disposing the wave-absorbing material B is large, and the distance between the wave-absorbing material B and the surfaces of the differential signal pins 106a and the ground pins 107 may be large, such as 3 to 5 mm. On the contrary, when the overall volume of the female connector 100 is small, the distance between the wave-absorbing material B and the surfaces of the differential signal pins 106a and the ground pins 107 may be small, such as 1 to 3 mm.

Further, a height of the ground pins 107 is greater than that of the differential signal pins 106a. In the embodiment illustrated in FIG. 4B, the wave-absorbing material B is spaced apart from all of the differential signal pins 106a and the ground pins 107. In other feasible embodiments, the wave-absorbing material B may only contact the ground pins 107 and be spaced apart from the differential signal pins 106a; and alternatively, the wave-absorbing material B only contacts the differential signal pins 106a and be spaced apart from the ground pins 107.

Figure 4C:
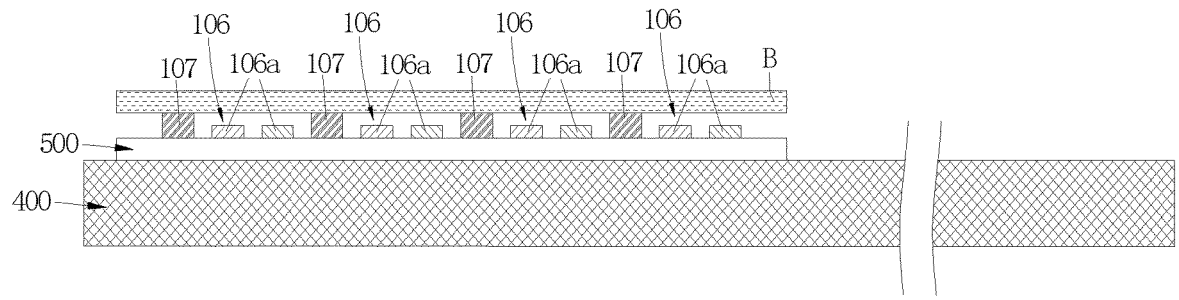
FIG. 4C is a structural schematic diagram of a third embodiment in a top view from a viewing angle D in FIG. 2.

Specifically, in another embodiment, the wave-absorbing material B may be disposed on the ground pins 107 and over the differential signal pins 106a. Specifically, as illustrated in FIG. 4C, the wave-absorbing material B is an integral structure, such as a layer-like structure, a sheet-like structure, a plate-like structure or a block-like structure, which is disposed on the upper surfaces of the ground pins 107, and supported by the ground pins 107 as support members. Since the height of the differential signal pins 106a is smaller than that of the ground pins 107, the wave-absorbing material B is located over and spaced apart from the differential signal pins 106a.

In this embodiment, a projection of the wave-absorbing material B toward the female terminal 101 (a downward direction illustrated in FIG. 4C) preferably covers all of the differential signal pins 106a and the ground pins 107. In this way, the wave-absorbing material B can maximally cover or block the differential signal pins 106a and the ground pins 107, thereby improving the wave absorption effect.

Figure 4D:
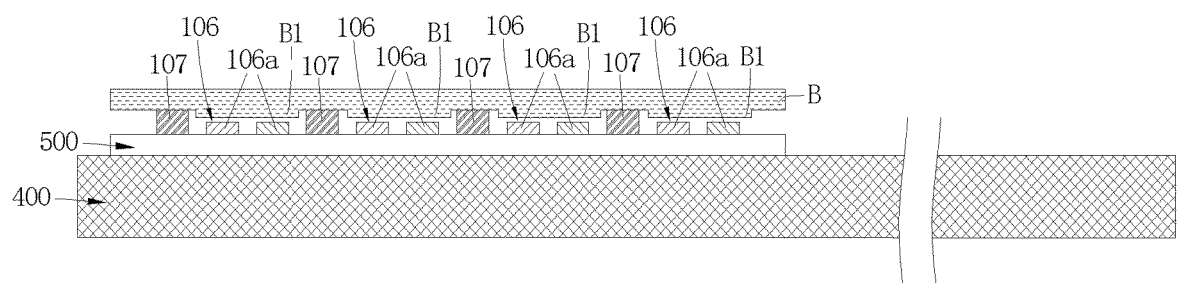
FIG. 4D is a structural schematic diagram of a fourth embodiment in a top view from a viewing angle D in FIG. 2.

In the above embodiment, since the wave-absorbing material B is supported by the ground pins 107, the wave-absorbing material B is in contact with the upper surfaces of the ground pins 107, while being spaced apart from the differential signal pins 106a. In order to reduce the distance between the wave-absorbing material B and the differential signal pins 106a so that the wave-absorbing material B can exert its wave absorbing function to the maximum extent, as illustrated in FIG. 4D, a surface of the wave-absorbing material B (a lower surface illustrated in FIG. 4D) may be formed with first protrusions B1 corresponding to the plurality of differential signal pairs 106, and each of the first protrusions B1 protrudes between two adjacent ones of the ground pins 107 and close to the differential signal pair 106. A projection of the first protrusion B1 toward the corresponding differential signal pair 106 covers the two differential signal pins 106a of the differential signal pair 106.

In this embodiment, the first protrusion B1 may be spaced apart from the differential signal pair 106 (specifically, the upper surfaces of the two differential signal pins 106a), or may be in contact with the surface of the differential signal pair 106, which is not limited herein. By forming the first protrusion B1 corresponding to and covering the differential signal pair 106 on the surface of the wave-absorbing material B, the distance between the wave-absorbing material B and the differential signal pins 106a can be reduced, thereby improving the absorption effect of the wave-absorbing material B on the differential signal pair 106.

Figure 4E:
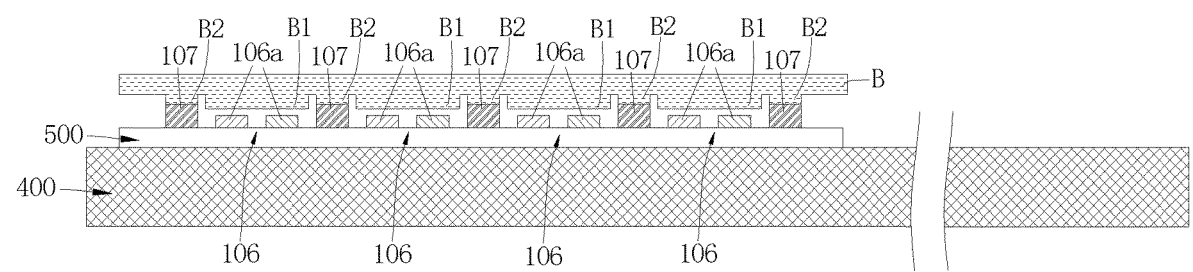
FIG. 4E is a structural schematic diagram of a fifth embodiment in a top view from a viewing angle D in FIG. 2.

Further, as illustrated in FIG. 4E, the wave-absorbing material B is formed on the surface thereof with second protrusions B2 corresponding to the ground pins 107, the second protrusions B2 being connected to the corresponding ground pins 107. In the embodiment including the first protrusions B1 and the second protrusions B2, the first protrusions B1 and the second protrusions B2 are integrally formed with the wave-absorbing material B that may be molded by injection molding. By forming the second protrusions B2 connected to the corresponding ground pins 107 on the surface of the wave-absorbing material B, the distance between the wave-absorbing material B and the differential signal pair 106 can be increased, so it is possible to dispose the first protrusions B1 with a larger thickness on the wave-absorbing material B. Thus, the thickness of a portion of the wave-absorbing material B corresponding to the differential signal pair 106 is increased, and the capacity of absorption of the high-frequency radiation signal generated by the differential signal pair 106 is improved.

Following the above description, in another feasible embodiment, the wave-absorbing material B may also be disposed on a plastic bracket (not illustrated). Specifically, the wave-absorbing material B is disposed close to the differential signal pairs 106 and the ground pins 107, so as to be as close as possible to a high-frequency radiation source. The material form may be a coating layer, an adhesion layer or a film, or a solid form. As described above, when the material form is the coating layer, the adhesive or the film, the wave-absorbing material B may be disposed on a surface of the plastic bracket. When the material form is the solid form, such as block, plate, sheet and any other tangible physical shape, the wave-absorbing material B may be fixed on the plastic bracket in any suitable way, for example including but not limited to, snap-fit connection, mechanical fastener connection by bolts and other fastening structures, soldering by ultrasonic, solvent, laser, etc., hot melting, clamping, snap connection, hook connection and integrated fastening features.

Further, the plastic bracket may be accommodated in a shell. In another feasible embodiment, the wave-absorbing material B may be disposed on the shell (not illustrated). Specifically, the wave-absorbing material B is disposed close to the differential signal pairs 106 and the ground pins 107. The material form may be a coating layer, an adhesion layer or a film, or a solid form. Please refer to the above description for detail, which will not be repeated herein.

Of course, the above embodiments are merely a few feasible schematic solutions, rather than restrictive solutions. That is, the position and way for disposing the wave-absorbing material B and the material form thereof include but are not limited to the above embodiments. In other feasible embodiments, for example, when the wave-absorbing material B is prepared in the form of liquid, powder, plastic particles, etc., a suitable implementation process may be adopted according to actual demands, which is not limited herein.

It should be noted that the plastic bracket, the shell, etc. included in the female connector 100 of the embodiment of the present disclosure may adopt any suitable existing configuration. In order to clearly and briefly explain the technical solution provided by this embodiment, the above parts will not be described in detail herein, and the drawings for the specification are also simplified accordingly. However, it should be understood that the embodiments of the present disclosure are not limited thereto in the spatial range.

Based on the same concept, an embodiment of the present disclosure further provides a connector combination formed by the mating of the female connector 100 and the male connector 200 or the gold finger circuit board 300 described in the above embodiments. Since the principle for the connector combination to solve problems and the technical effect that can be achieved are similar to those of the female connector 100, the implementation of the female connector 100 as described above may be referred to for the implementation of the connector combination, and the repeated content will be omitted here.

It should be noted that as an independent embodiment, the connector combination provided in the embodiment of the present disclosure may refer to the female connector 100 as described above, but should not be limited to the effect produced by the female connector 100.

FIG. 1 illustrates a structural schematic diagram of a connector combination formed by the mating of a male connector 200 and the female connector 100 described in the above embodiments. In which, the male connector 200 includes a male terminal 202 for mating with the female terminal 101. When the first end 101*a* of the female terminal 101 is mated with the male terminal 202, a high-frequency radiation area A is formed in the vicinity of a joint between the differential signal pair 106 and the conductive pad 500, and a wave-absorbing material B is disposed in a spatial range covered by the high-frequency radiation area A.

FIG. 2 illustrates a structural schematic diagram of a connector combination formed by the mating of a gold finger circuit board 300 and the female connector 100 described in the above embodiments. In which, the gold finger circuit board 300 includes a gold finger insertion tip 301 inserted into the female terminal 101. When the first end 101*a* of the female terminal 101 is mated with the gold finger insertion tip 301, a high-frequency radiation area A is formed in the vicinity of a joint between the differential signal pair 106 and the conductive pad 500, and a wave-absorbing material B is disposed in a spatial range covered by the high-frequency radiation area A.

The inventor of the present disclosure creatively discovered and found out that a high-frequency radiation can be easily generated in the vicinity of the joint between the differential signal pair 106 and the conductive pad 500 due to an antenna effect during the use of the connector, and practices show that the wave-absorbing material B only needs to be disposed in the area where the high-frequency radiation can be easily generated rather than areas where the high-frequency radiation is not generated. By selectively or pertinently disposing the wave-absorbing material B, signals are also selectively absorbed by the wave-absorbing material B. That is, only crosstalk signals are absorbed without affecting normal signals, so that the integrity of differential signals can be well ensured.

In addition, the way of selectively or pertinently disposing the wave-absorbing material B in the high-frequency radiation area is adopted to replace the way of entirely wrapping (a plastic bracket and a shell) with a wave-absorbing material B in the prior art, so as to overcome the signal crosstalk without using any additional shielding material, which not only greatly reduces the use amount of the wave-absorbing material B, as well as an overall weight and costs of consumables and process implementation of the connector, but also helps in improving the density of differential pairs, and meeting the application requirements of high-speed and high-density connectors in the current technical development.

It should be noted that in the description of the present disclosure, the terms 'first' and 'second' are only used for the descriptive purpose and to distinguish similar objects. These terms neither specify any sequential order, nor indicate or imply relative importance. In addition, in the description of the present disclosure, 'a plurality of' means two or more, unless otherwise stated.

Those described above are just a few embodiments of the present disclosure, and a person skilled in the art can make various changes or modifications to the embodiments of the present disclosure according to the content disclosed in the application document without departing from the spirit and scope of the present disclosure.

The invention claimed is:

1. A female connector configured for being connected to a PCB board that is internally provided with a signal layer and a ground layer, the PCB board being provided on a surface thereof with conductive pads that are connected to the signal layer and the ground layer, wherein the female connector comprises:
   a female terminal having a first end for mating with a male connector or a gold finger circuit board, and a second end opposite to the first end, the second end being provided with a plurality of differential signal pairs arranged at intervals and ground pins each located between any two adjacent pairs of the differential signal pairs, the differential signal pairs being connectable to the signal layer through the conductive pads, the ground pins being connectable to the ground layer through the conductive pads, and a high-frequency radiation area being formed in the vicinity of a joint between the differential signal pairs and the conductive pads when the first end is mated with the male connector or the gold finger circuit board; and
   a wave-absorbing material disposed in a spatial range covered by the high-frequency radiation area.

2. The female connector according to claim 1, wherein:
   the PCB board is provided therein with copper deposition holes for connecting the signal layer and the ground layer to a surface of the PCB board;
   the conductive pads are connected to the signal layer and the ground layer through the copper deposition holes; and
   the high-frequency radiation area is formed in an area outside the copper deposition holes at the joint between the conductive pads and the differential signal pairs.

3. The female connector according to claim 1, wherein the wave-absorbing material wraps at least an upper surface of each of the ground pins.

4. The female connector according to claim 1, wherein each of the differential signal pairs comprises two differential signal pins, and wherein:
   the wave-absorbing material is disposed on the differential signal pins and the ground pins; or
   the wave-absorbing material is disposed close to the differential signal pins and the ground pins.

5. The female connector according to claim 4, wherein the female terminal is partially wrapped and fixed by a plastic bracket which is accommodated in a shell; the wave-absorbing material is disposed on the plastic bracket and/or the shell and is close to the differential signal pins and the ground pins.

6. The female connector according to claim 4, wherein the wave-absorbing material wraps at least an upper surface of each of the differential signal pins.

7. The female connector according to claim 6, wherein the wave-absorbing material wraps at least an upper surface of each of the ground pins.

8. The female connector according to claim 4, wherein:
   a height of the ground pins is greater than that of the differential signal pins; and
   the wave-absorbing material is an integral structure disposed on upper surfaces of the ground pins and spaced apart from the differential signal pins.

9. The female connector according to claim 8, wherein a surface of the wave-absorbing material is formed with second protrusions corresponding to the ground pins, the second protrusions being connected to the corresponding ground pins.

10. The female connector according to claim 8, wherein:
a surface of the wave-absorbing material is formed with first protrusions corresponding to the plurality of differential signal pairs, each of the first protrusions protruding between two adjacent pins of the ground pins and close to the differential signal pair; and
a projection of the first protrusion toward the corresponding differential signal pair covers the two differential signal pins of the differential signal pair.

11. The female connector according to claim 10, wherein a surface of the wave-absorbing material is formed with second protrusions corresponding to the ground pins, the second protrusions being connected to the corresponding ground pins.

12. A connector combination comprising a male connector and a female connector, wherein:
the male connector comprises a male terminal;
the female connector is configured for being connected to a PCB board that is internally provided with a signal layer and a ground layer, the PCB board being provided on a surface thereof with conductive pads that are connected to the signal layer and the ground layer; and
the female connector comprises:
a female terminal having a first end for mating with the male connector, and a second end opposite to the first end, the second end being provided with a plurality of differential signal pairs arranged at intervals and ground pins each located between any two adjacent pairs of the differential signal pairs, the differential signal pairs being connectable to the signal layer through the conductive pads, the ground pins being connectable to the ground layer through the conductive pads, and a high-frequency radiation area being formed in the vicinity of a joint between the differential signal pairs and the conductive pads when the first end is mated with the male connector; and
a wave-absorbing material disposed in a spatial range covered by the high-frequency radiation area.

13. The connector combination according to claim 12, wherein:
the PCB board is provided therein with copper deposition holes for connecting the signal layer and the ground layer to a surface of the PCB board;
the conductive pads are connected to the signal layer and the ground layer through the copper deposition holes; and
the high-frequency radiation area is formed in an area outside the copper deposition holes at the joint between the conductive pads and the differential signal pairs.

14. The connector combination according to claim 13, wherein the wave-absorbing material wraps at least an upper surface of each of the ground pins.

15. The connector combination according to claim 12, wherein:
each of the differential signal pairs comprises two differential signal pins;
the wave-absorbing material is disposed on the differential signal pins and the ground pins, or the wave-absorbing material is disposed close to the differential signal pins and the ground pins; and
the wave-absorbing material wraps at least an upper surface of each of the differential signal pins.

16. The connector combination according to claim 15, wherein the wave-absorbing material wraps at least an upper surface of each of the ground pins.

17. The connector combination according to claim 12, wherein:
each of the differential signal pairs comprises two differential signal pins;
the wave-absorbing material is disposed on the differential signal pins and the ground pins, or the wave-absorbing material is disposed close to the differential signal pins and the ground pins;
a height of the ground pins is greater than that of the differential signal pins; and
the wave-absorbing material is an integral structure disposed on upper surfaces of the ground pins and spaced apart from the differential signal pins.

18. The connector combination according to claim 17, wherein a surface of the wave-absorbing material is formed with second protrusions corresponding to the ground pins, the second protrusions being connected to the corresponding ground pins.

19. The connector combination according to claim 17, wherein:
a surface of the wave-absorbing material is formed with first protrusions corresponding to the plurality of differential signal pairs, each of the first protrusions protruding between two adjacent pins of the ground pins and close to the differential signal pair; and
a projection of the first protrusion toward the corresponding differential signal pair covers the two differential signal pins of the differential signal pair.

20. The connector combination according to claim 19, wherein a surface of the wave-absorbing material is formed with second protrusions corresponding to the ground pins, the second protrusions being connected to the corresponding ground pins.

21. A connector combination comprising a gold finger circuit board and a female connector, wherein:
the gold finger circuit board comprises a gold finger insertion tip;
the female connector is configured for being connected to a PCB board that is internally provided with a signal layer and a ground layer, the PCB board being provided on a surface thereof with conductive pads that are connected to the signal layer and the ground layer; and
the female connector comprises:
a female terminal having a first end for mating with the gold finger insertion tip, and a second end opposite to the first end, the second end being provided with a plurality of differential signal pairs arranged at intervals and ground pins each located between any two adjacent pairs of the differential signal pairs, the differential signal pairs being connectable to the signal layer through the conductive pads, the ground pins being connectable to the ground layer through the conductive pads, and a high-frequency radiation area being formed in the vicinity of a joint between the differential signal pairs and the conductive pads when the first end is mated with the gold finger insertion tip; and
a wave-absorbing material disposed in a spatial range covered by the high-frequency radiation area.

22. The connector combination according to claim 21, wherein:
the PCB board is provided therein with copper deposition holes for connecting the signal layer and the ground layer to a surface of the PCB board;

the conductive pads are connected to the signal layer and the ground layer through the copper deposition holes; and the high-frequency radiation area is formed in an area outside the copper deposition holes at the joint between the conductive pads and the differential signal pairs.

23. The connector combination according to claim 21, wherein the wave-absorbing material wraps at least an upper surface of each of the ground pins.

24. The connector combination according to claim 21, wherein:

each of the differential signal pairs comprises two differential signal pins;

the wave-absorbing material is disposed on the differential signal pins and the ground pins, or the wave-absorbing material is disposed close to the differential signal pins and the ground pins; and the wave-absorbing material wraps at least an upper surface of each of the differential signal pins.

25. The connector combination according to claim 24, wherein the wave-absorbing material wraps at least an upper surface of each of the ground pins.

26. The connector combination according to claim 21, wherein:

each of the differential signal pairs comprises two differential signal pins;

the wave-absorbing material is disposed on the differential signal pins and the ground pins, or the wave-absorbing material is disposed close to the differential signal pins and the ground pins;

a height of the ground pins is greater than that of the differential signal pins; and the wave-absorbing material is an integral structure disposed on upper surfaces of the ground pins and spaced apart from the differential signal pins.

27. The connector combination according to claim 26, wherein a surface of the wave-absorbing material is formed with second protrusions corresponding to the ground pins, the second protrusions being connected to the corresponding ground pins.

28. The connector combination according to claim 26, wherein:

a surface of the wave-absorbing material is formed with first protrusions corresponding to the plurality of differential signal pairs, each of the first protrusions protruding between two adjacent pins of the ground pins and close to the differential signal pair; and a projection of the first protrusion toward the corresponding differential signal pair covers the two differential signal pins of the differential signal pair.

29. The connector combination according to claim 28, wherein a surface of the wave-absorbing material is formed with second protrusions corresponding to the ground pins, the second protrusions being connected to the corresponding ground pins.

* * * * *